US008659937B2

(12) United States Patent
Adams et al.

(10) Patent No.: US 8,659,937 B2
(45) Date of Patent: Feb. 25, 2014

(54) IMPLEMENTING LOW POWER WRITE DISABLED LOCAL EVALUATION FOR SRAM

(75) Inventors: Chad A. Adams, Byron, MN (US); Sharon H. Cesky, Rochester, MN (US); Elizabeth L. Gerhard, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 13/368,918

(22) Filed: Feb. 8, 2012

(65) Prior Publication Data
US 2013/0201753 A1    Aug. 8, 2013

(51) Int. Cl.
*G11C 11/00* (2006.01)
*G11C 7/00* (2006.01)
*G11C 7/22* (2006.01)

(52) U.S. Cl.
USPC ....... 365/154; 365/156; 365/189.16; 365/203

(58) Field of Classification Search
USPC ........................................................ 365/154
See application file for complete search history.

(56) References Cited

U.S. PATENT DOCUMENTS

| | | | |
|---|---|---|---|
| 5,490,111 A | | 2/1996 | Sakata |
| 6,091,629 A | * | 7/2000 | Osada et al. ................. 365/156 |
| 6,430,073 B1 | * | 8/2002 | Batson et al. ................. 365/49.1 |
| 6,452,851 B1 | * | 9/2002 | Endo et al. ..................... 365/205 |
| 6,512,711 B1 | | 1/2003 | Wright et al. |
| 7,239,559 B2 | * | 7/2007 | Adams et al. ............ 365/189.15 |
| 7,352,648 B2 | | 4/2008 | Akiyoshi |
| 7,499,312 B2 | * | 3/2009 | Matick et al. ................. 365/154 |
| 7,577,051 B1 | | 8/2009 | Kim |
| 7,715,221 B2 | | 5/2010 | Christensen et al. |
| 2010/0142279 A1 | | 6/2010 | Kono et al. |

OTHER PUBLICATIONS

Kouichi Kanda et al., 90% Write Power-Saving SRAM Using Sense-Amplifying Memory Cell, IEEE Journal of Solid-State Circuits, vol. 39, No. 6, pp. 917-933, Jun. 2004.
Rajiv V. Joshi et al., A Novel Column-Decoupled 8T Cell for Low-Power Differential and Domino-Based SRAM Design, IEEE Transactions on Very Large Scale Integration (VLSI) Systems, vol. 19, No. 5, pp. 869-882, May 2011.
Ramy E. Aly et al., Dual Sense Amplified Bit Lines (DSABL) Architecture for Low-Power SRAM Design, IEEE International Symposium on Circuits and Systems (ISCAS 2005), vol. 2, pp. 1650-1653.

* cited by examiner

*Primary Examiner* — Son Mai
(74) *Attorney, Agent, or Firm* — Joan Pennington

(57) ABSTRACT

A method and circuit for implementing low power write disabled local evaluation for Static Random Access Memory (SRAM), and a design structure on which the subject circuit resides are provided. The circuit includes a write disable function to prevent discharge of a global bit line during a write operation. The write disable function disables a NAND gate driving a global pull down device during the write operation preventing the global pull down device from discharging the global bit line.

20 Claims, 3 Drawing Sheets

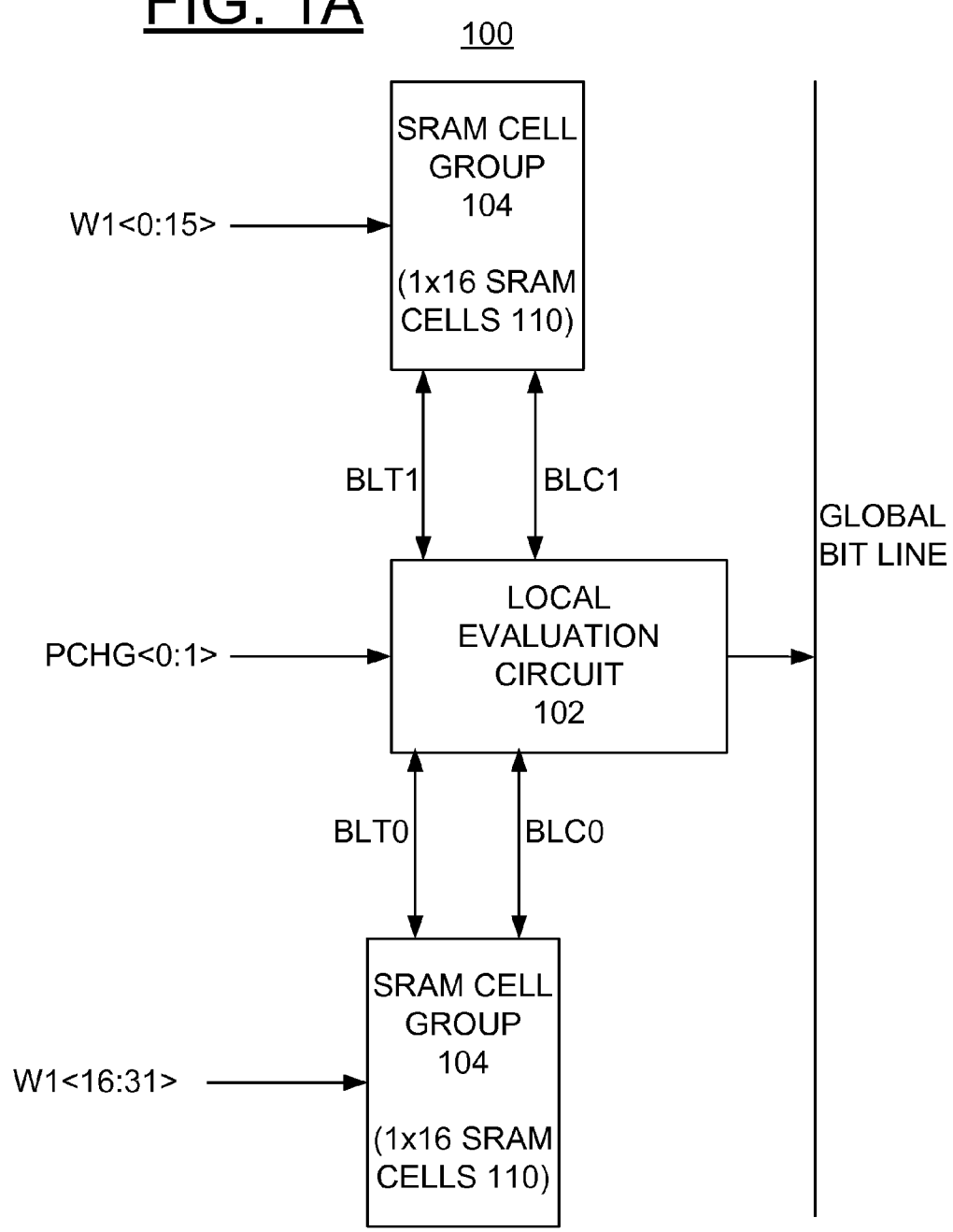

US 8,659,937 B2

IMPLEMENTING LOW POWER WRITE DISABLED LOCAL EVALUATION FOR SRAM

FIELD OF THE INVENTION

The present invention relates generally to the data processing field, and more particularly, relates to a method and circuit for implementing low power write disabled local evaluation for Static Random Access Memory (SRAM), and a design structure on which the subject circuit resides.

DESCRIPTION OF THE RELATED ART

Static Random Access Memories (SRAMs) are normally accessed via a sense amplifier or domino read methodology. SRAMs that are accessed via domino read are typically divided up into groups of 32 cells with two groups of 16 cells connected via a common local bitline.

In a conventional implementation of a domino read SRAM, two groups of 16 cells feed a local evaluation circuit. The local evaluation circuit enables read and write functions, including a NAND gate, a global pull down device, and various implementations of write circuitry.

Write data signals WT and WC run to all groups of 32 cells representing data being written into the array. Often there is a second level domino stage or global evaluation circuit that is used to evaluate the combination of all the different groups of 32 cells. The groups of 32 cells are connected to a global dot line or global bit line via the output of the global pull down device in the local evaluation circuit.

The NAND gate of the local evaluation receives either a true or compliment bitline of the upper and lower group of cells. During a read operation, the output of the NAND gate drives a global pull down device whose output is connected to a global dot line. When the array is being read only one set or group of the 16 cells can be accessed at a given time meaning that only one of the bitline groups will discharge while the other remains precharged. The discharge of the bitline drives the output of the NAND gate to a 1 or high which then activates the global pull down device discharging the global dot line.

When performing a write operation the local evaluation circuitry drives both the true and compliment bitlines for a group of 16 cells such that a 0 or 1 is written. A problem results since the NAND gate used to evaluate a read is connected to either the true or compliment bitline, a write operation also activates the NAND gate driving the global pull down device to discharge the global bit line. The discharge of the global bit line during the write operation requires that some circuitry used during a read operation to eliminate paths between the voltage supply rails VDD and GND must also be activated during the write operation.

A need exists for a circuit having an efficient and effective mechanism for implementing low power write disabled local evaluation for SRAMs.

SUMMARY OF THE INVENTION

Principal aspects of the present invention are to provide a method and circuit for implementing low power write disabled local evaluation for Static Random Access Memory (SRAM), and a design structure on which the subject circuit resides. Other important aspects of the present invention are to provide such method, circuit and design structure substantially without negative effects and that overcome many of the disadvantages of prior art arrangements.

In brief, a method and circuit for implementing low power write disabled local evaluation for Static Random Access Memory (SRAM), and a design structure on which the subject circuit resides are provided. The circuit includes a write disable function to prevent discharge of a global bit line during a write operation. The write disable function disables a NAND gate driving a global pull down device during the write operation preventing the global pull down device from discharging the global bit line.

In accordance with features of the invention, the write disable function includes a first field effect transistor coupling a positive voltage supply rail to the NAND gate. The first field effect transistor is turned off by a write data signal, disabling the NAND gate during the write operation. The first field effect transistor is implemented with a P-channel field effect transistor (PFET).

In accordance with features of the invention, the write disable function includes a second field effect transistor coupling a ground voltage supply rail to an output of the NAND gate. The second field effect transistor is turned on by a write data signal, holding the output of the NAND gate low during the write operation. The second field effect transistor is implemented with an N-channel field effect transistor (NFET).

In accordance with features of the invention, the write data signal is held low during a read operation.

BRIEF DESCRIPTION OF THE DRAWINGS

The present invention together with the above and other objects and advantages may best be understood from the following detailed description of the preferred embodiments of the invention illustrated in the drawings, wherein:

FIGS. 1A and 1B schematically illustrates an example circuit for implementing enhanced low power write disabled local evaluation for Static Random Access Memory (SRAM) in accordance with a preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing low power write disabled local evaluation for Static Random Access Memory (SRAM), and a design structure on which the subject circuit resides are provided. The circuit includes a write disable function to prevent discharge of the global bit line during a write operation. The write data signals WT and WC represent the data being written into the array. The write disable function includes a first field effect transistor coupling a positive voltage supply rail to a NAND gate. The first field effect transistor is turned off by a write data signal WT, disabling the NAND gate during the write operation preventing the global pull down device from discharging the global bit line. The write disable function includes a second field effect transistor coupling a ground voltage supply rail to an output of the NAND gate. The second field effect transistor is turned on by the write data signal WT, holding the output of the NAND gate low during the write operation.

Figure 1B:
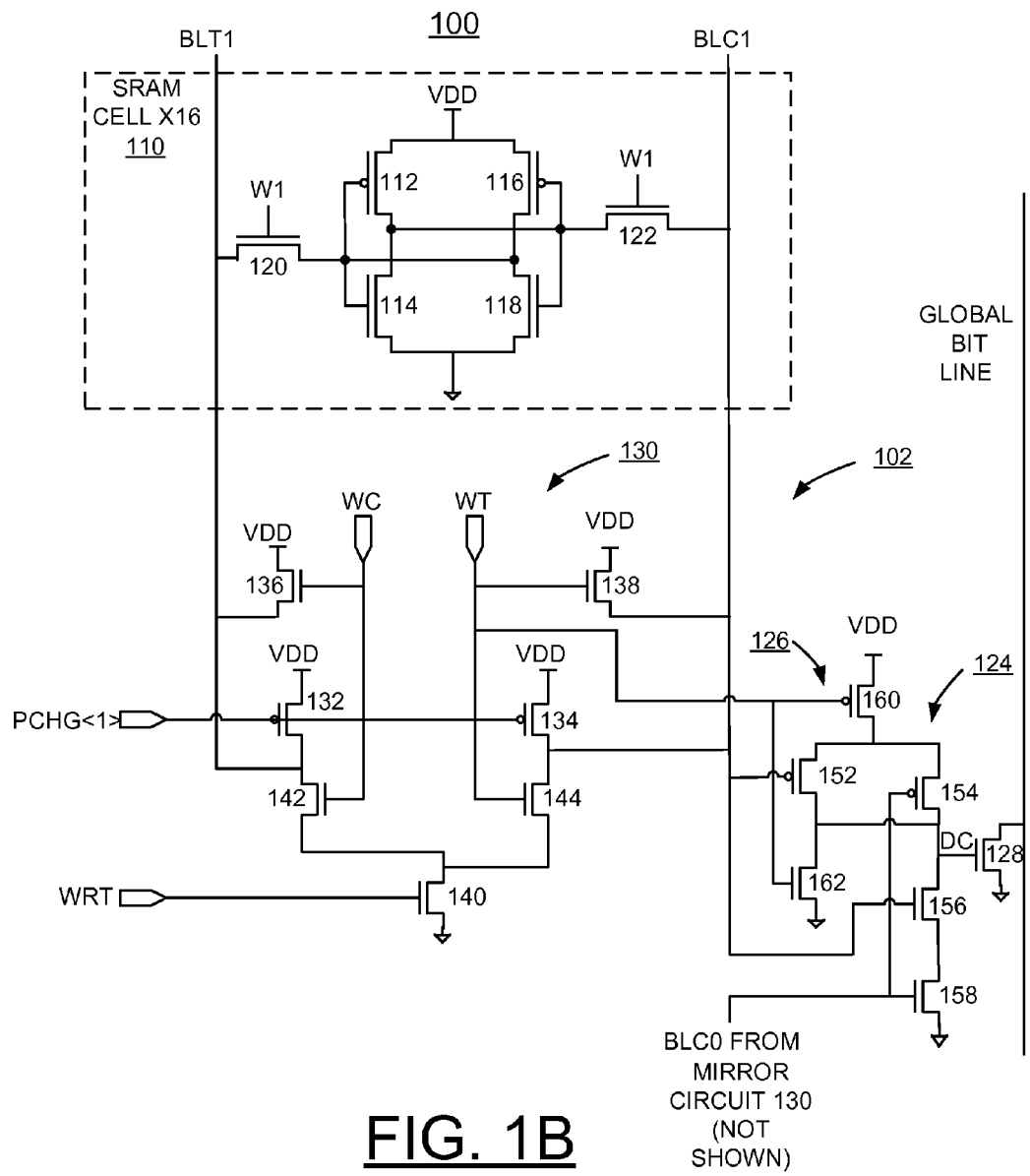

Having reference now to the drawings, in FIGS. 1A and 1B, there is shown a circuit for implementing low power write disabled local evaluation for static random access memory (SRAM) generally designated by the reference character 100 in accordance with the preferred embodiment. SRAM circuit 100 includes a local evaluation circuit 102 of the preferred embodiment coupled to respective true and complement bit lines BLT1, BLC1 and BLT0, BLC0 of a pair of local SRAM cell groups 104. Each SRAM cell group 104 includes a plurality of SRAM cells 110, such as six-transistor SRAM cells 110, shown in FIG. 1B. SRAM circuit 100 typically includes 32 SRAM cells 110 arranged in two groups 104 of 16 SRAM cells 110.

The local evaluation circuit 102 of the preferred embodiment enables read and write functions, providing an output connected to a global bit line and prevents discharge of the global bit line during a write operation in accordance with the preferred embodiment. In accordance with the preferred embodiment, no changes to the function of the signals feeding into the evaluation circuit 102 are required.

Referring to FIG. 1B, each SRAM cell 110 includes four transistors 112, 114, 116, and 118 configured as a cross-coupled latch for storing data. A pair of transistors 120, 122 is used to obtain access to the memory cell. A wordline input W1 provides a gate input to the N-channel field effect transistor (NFETs) 120, 122. A particular wordline input W1 is activated, turning on respective NFETs 120, 122 to perform a read or write operation.

The local evaluation circuit 102 includes a NAND gate 124 together with a write disable function 126 connected to a global pull down device 128 at a node DC, and write circuitry 130. The write disable function 126 uses a write data signal WT to prevent discharge of the global bit line. The write signal WRT is used in SRAM circuit 100 where a write operation is differentiated from a read operation. A respective true bitline and complement bitline are driven by the write data signals WT and WC signals that connect to all groups of 32 cells and represent the data being written into the cell during the write operation.

In FIG. 1B, SRAM circuit 100 is shown in simplified form sufficient for understanding the present invention. For example, not shown is mirror write circuitry of the illustrated write circuitry 130 receiving precharge signal PCHG<0> and connected to true and complement bit lines BLT0, BLC0 of the other SRAM cell group 104 with the write data signals WT and WC signals connected to true and complement bit lines BLT0, BLC0.

As shown in FIG. 1B, the local evaluation circuit 102 is coupled to illustrated SRAM cell 110 with the true and complement bit lines BLT1, BLC1 of the upper local SRAM cell group 104. The local evaluation circuit 102 receives precharge signals with the precharge signal PCHG<1> shown. The write data signals WT, WC are used to drive the respective BLT1, BLC1 nodes to the appropriate value when writing the respective SRAM cell group 104. The write data signals WT, WC are held low or at zero during a read operation when a write is not occurring. The write data signals WT, WC are held at opposite states when a write is occurring, that is only one of the write data signals WT, WC can be driven high or to a 1.

Write circuitry 130 of the local evaluation circuit 102 includes the respective write data signals WT, WC used for driving the true and complement bit lines BLT1, BLC1 to the appropriate value when writing the upper local SRAM cell group 104. The write data signal WT is held low during a read operation.

Write circuitry 130 includes a pair of precharge P-channel field effect transistors (PFETs) 132, 134 respectively coupled between a voltage supply rail VDD and the respective true and complement bit lines BLT1, BLC1. The precharge signal PCHG<1> is applied to a gate of each precharge PFETs 132, 134 for precharging the respective true and complement bit lines BLT1, BLC1.

Write circuitry 130 includes a first pair of N-channel field effect transistors (NFETs) 136, 138 used for driving the true and complement bit lines BLT1, BLC1 during the write operation. The respective write data signals WC, WT are respectively applied to a gate of the NFETs 136, 138. NFETs 136, 138 are coupled between the voltage supply rail VDD and the respective true and complement bit lines BLT1, BLC1.

Write circuitry 130 includes an NFET 140 receiving a gate input of the write signal WRT and respectively connected between a ground potential rail and a second pair of N-channel field effect transistors (NFETs) 142, 144. The respective write data signals WC, WT are respectively applied to a gate of the respective NFETs 142, 144. The NFETs 142, 144 are connected between the NFET 140 and the NFETs 136, 138 at connection to the respective true and complement bit lines BLT1, BLC1.

The precharge signal PCHG<1> drives the true bitline and the complement bitline BLT1, BLC1 to a 1 or high during a precharge phase when either reading or writing the SRAM. The wordline signal W1 is used to access the SRAM cell 110 and goes high when either a read or write is occurring, during an evaluate phase, and remains low during the precharge phase. The precharge signal PCHG<1> is high when reading or writing the array, and encompasses the SRAM access wordline signal W1. The respective write data signals WC, WT are setup and held around the precharge signal PCHG<1> and the write signal WRT during a write operation. The write signal WRT is used in designs where a write is differentiated from a read, and can be simply tied to the same driver as the precharge signal PCHG<1> so that the write signal WRT goes high during a write or read and stays low during the precharge phase.

The NAND gate 124 of the local evaluation circuit 102 includes a pair of PFETs 152, 154 connected to the global pull down device 128 at node DC and a pair of series connected NFETs 156, 158. The write disable function 126 is connected to the NAND gate 124 and the global pull down device 128 preventing discharge of a global bit line during a write operation.

The write disable function 126 in accordance with features of the preferred embodiment disables the NAND gate 124 before the local bitlines BLT1, BLC1 begin to discharge. The write disable function 126 disables the global pull down device 128 during the write operation preventing the global pull down device from discharging the global bit line. An advantage of the write disable function 126 is that the write data signals WT are already used in typical SRAM implementations so no new signals or functionality are required.

In accordance with features of the invention, the write disable function 126 includes a first field effect transistor PFET 160 receiving a gate input of the write data signal WT and coupling the positive voltage supply rail VDD to the NAND gate 124. The first PFET 160 is turned off by the write data signal WT, disabling the NAND gate 124 and the global pull down device 128 and preventing discharge of a global bit line during the write operation.

In accordance with features of the invention, the write disable function 126 includes a second field effect transistor NFET 162 receiving a gate input of the write data signal WT and coupling the ground potential rail to the output of the NAND gate 124 at node DC. The second NFET 162 is turned on by the write data signal WT, holding the output of the NAND gate 124 low and disabling the global pull down device 128 during the write operation preventing discharge of a global bit line.

The global pull down device 128 in the local evaluation circuit 102 typically is rather large, so disabling the global pull down device 128 during the write operation provides a generally substantial or large power savings and also reduces the switching factor on the pull down device 128, for example, by approximately twenty-five percent assuming half of your operations are a write with the other half being a write of a data state such that the global bit line will be discharged.

Figure 2:
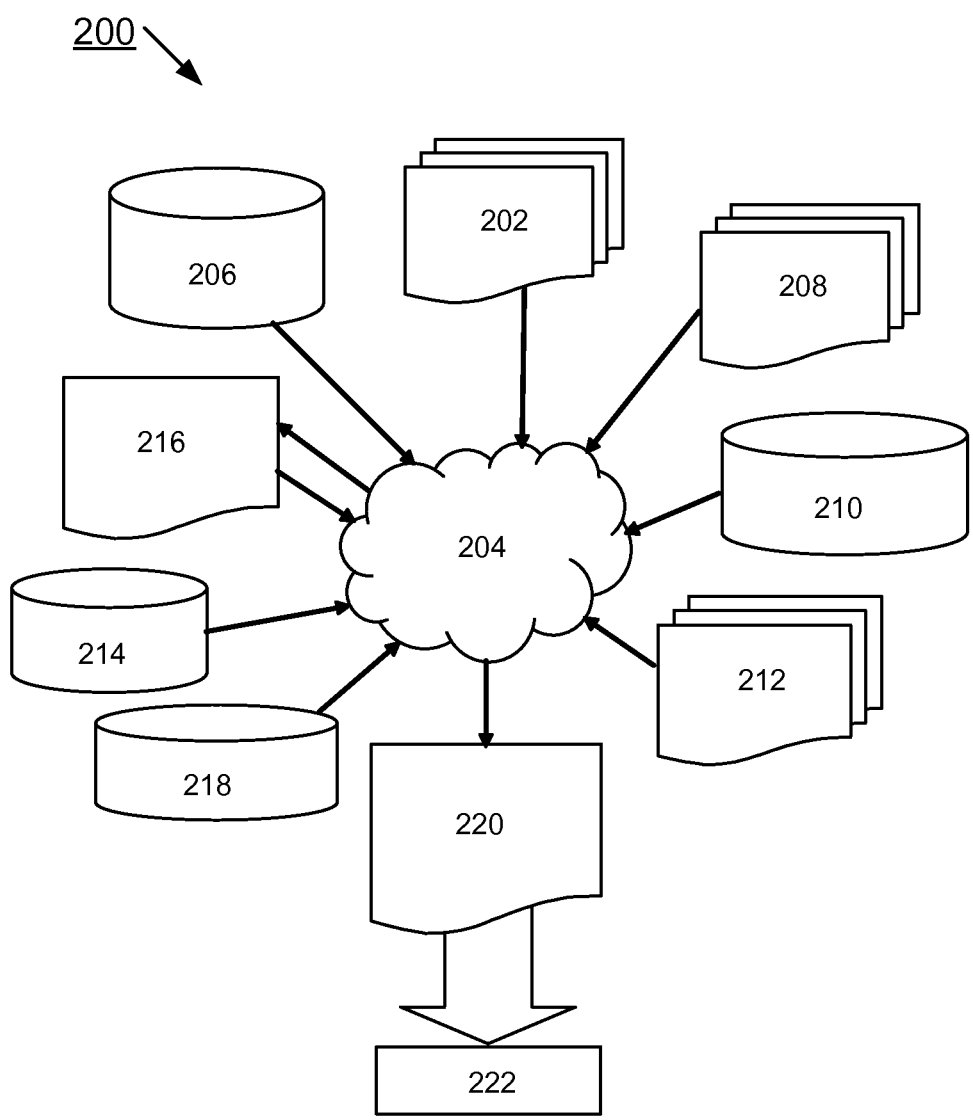
FIG. 2 is a flow diagram of a design process used in semiconductor design, manufacturing, and/or test.

FIG. 2 is a flow diagram of a design process used in semiconductor design, manufacturing, and/or test. FIG. 2 shows a block diagram of an example design flow 200. Design flow 200 may vary depending on the type of IC being designed. For example, a design flow 200 for building an application specific IC (ASIC) may differ from a design flow 200 for designing a standard component. Design structure 202 is preferably an input to a design process 204 and may come from an IP provider, a core developer, or other design company or may be generated by the operator of the design flow, or from other sources. Design structure 202 comprises circuit 100 in the form of schematics or HDL, a hardware-description language, for example, Verilog, VHDL, C, and the like. Design structure 202 may be contained on one or more machine readable medium. For example, design structure 202 may be a text file or a graphical representation circuit 100. Design process 204 preferably synthesizes, or translates, circuit 100 into a netlist 206, where netlist 206 is, for example, a list of wires, transistors, logic gates, control circuits, I/O, models, etc. that describes the connections to other elements and circuits in an integrated circuit design and recorded on at least one of machine readable medium. This may be an iterative process in which netlist 206 is resynthesized one or more times depending on design specifications and parameters for the circuit.

Design process 204 may include using a variety of inputs; for example, inputs from library elements 204 which may house a set of commonly used elements, circuits, and devices, including models, layouts, and symbolic representations, for a given manufacturing technology, such as different technology nodes, 42 nm, 45 nm, 90 nm, and the like, design specifications 210, characterization data 212, verification data 214, design rules 216, and test data files 218, which may include test patterns and other testing information. Design process 204 may further include, for example, standard circuit design processes such as timing analysis, verification, design rule checking, place and route operations, and the like. One of ordinary skill in the art of integrated circuit design can appreciate the extent of possible electronic design automation tools and applications used in design process 204 without deviating from the scope and spirit of the invention. The design structure of the invention is not limited to any specific design flow.

Design process 204 preferably translates embodiments of the invention as shown in FIGS. 1A and 1B, along with any additional integrated circuit design or data (if applicable), into a second design structure 220. Design structure 220 resides on a storage medium in a data format used for the exchange of layout data of integrated circuits, for example, information stored in a GDSII (GDS2), GL1, OASIS, or any other suitable format for storing such design structures. Design structure 220 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A and 1B. Design structure 220 may then proceed to a stage 222 where, for example, design structure 220 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing low power write disabled local evaluation for Static Random Access Memory (SRAM) comprising:
 a global bit line;
 a global pull down device coupled to said global bit line;
 a NAND gate driving said global pull down device;
 a write disable function coupled to said NAND gate and said global pull down device; said write disable function disabling said NAND gate during the write operation preventing said global pull down device from discharging the global bit line.

2. The circuit as recited in claim 1 wherein said write disable function includes a first field effect transistor coupling a positive voltage supply rail to said NAND gate.

3. The circuit as recited in claim 2 wherein said first field effect transistor is turned off by a write data signal, disabling said NAND gate during the write operation.

4. The circuit as recited in claim 2 wherein said first field effect transistor is implemented with a P-channel field effect transistor (PFET).

5. The circuit as recited in claim 2 wherein said write disable function includes a second field effect transistor coupling a ground voltage supply rail to an output of said NAND gate.

6. The circuit as recited in claim 5 wherein said second field effect transistor is turned on by a write data signal, holding the output of said NAND gate low during the write operation.

7. The circuit as recited in claim 5 wherein said second field effect transistor is implemented with an N-channel field effect transistor (NFET).

8. The circuit as recited in claim 7 wherein said write data signal is held low disabling said write disable function during the read operation.

9. A design structure embodied in a non-transitory machine readable medium used in a design process, the design structure comprising:
 a circuit tangibly embodied in the non-transitory machine readable medium used in the design process, said circuit for implementing low power write disabled local evaluation for Static Random Access Memory (SRAM), said circuit comprising:
 a global bit line;
 a global pull down device coupled to said global bit line;

a NAND gate driving said global pull down device;

a write disable function coupled to said NAND gate and said global pull down device; said write disable function disabling said NAND gate during the write operation preventing said global pull down device from discharging the global bit line, wherein the design structure, when read and used in the manufacture of a semiconductor chip produces a chip comprising said circuit.

10. The design structure of claim 9, wherein the design structure comprises a netlist, which describes said circuit.

11. The design structure of claim 9, wherein the design structure resides on storage medium as a data format used for the exchange of layout data of integrated circuits.

12. The design structure of claim 9, wherein the design structure includes at least one of test data files, characterization data, verification data, or design specifications.

13. The design structure of claim 9, wherein said write disable function includes a first field effect transistor coupling a positive voltage supply rail to said NAND gate, said first field effect transistor being turned off by a write data signal, disabling said NAND gate during the write operation.

14. The design structure of claim 9, wherein said write disable function includes a second field effect transistor coupling a ground voltage supply rail to an output of said NAND gate; said second field effect transistor is turned on by a write data signal, holding the output of said NAND gate low during the write operation.

15. A method for implementing low power write disabled local evaluation for Static Random Access Memory (SRAM) comprising:
providing a global bit line;
providing a global pull down device coupled to said global bit line;
providing a NAND gate driving said global pull down device;
providing a write disable function coupled to said NAND gate and said global pull down device for preventing said global pull down device from discharging the global bit line; and enabling said write disable function for disabling said NAND gate during the write operation.

16. The method as recited in claim 15 wherein enabling said write disable function for disabling said NAND gate during the write operation preventing said global pull down device from discharging the global bit line includes providing a write data signal for enabling said write disable function during the write operation.

17. The method as recited in claim 15 wherein providing said write disable function coupled to said NAND gate and said global pull down device includes providing said write disable function with a first field effect transistor coupling a positive voltage supply rail to said NAND gate; and said first field effect transistor is turned off by a write data signal, disabling said NAND gate during the write operation.

18. The method as recited in claim 17 wherein providing said write disable function coupled to said NAND gate and said global pull down device includes providing said write disable function with a second field effect transistor coupling a ground voltage supply rail to an output of said NAND gate; and said second field effect transistor is turned on by a write data signal, holding the output of said NAND gate low during the write operation.

19. The method as recited in claim 18 wherein said first field effect transistor is implemented by a P-channel field effect transistor (PFET).

20. The method as recited in claim 18 wherein said second field effect transistor is implemented by an N-channel field effect transistor (NFET).

* * * * *